United States Patent [19]
Laub et al.

[11] Patent Number: 5,744,284
[45] Date of Patent: Apr. 28, 1998

[54] METHOD FOR FABRICATING RESILIENT Z-AXIS CONTACTS FOR ELECTRICALLY INTERCONNECTING INTEGRATED CIRCUITS ON A PLURALITY OF STACKED CARRIERS

[75] Inventors: Soyeon P. Laub, Los Angeles; Michael J. Little, Woodland Hills; James A. Foschaar, Thousand Oaks; Hugh L. Garvin, Malibu; Michael W. Yung, Los Angeles, all of Calif.

[73] Assignee: Hughes Aircraft Company

[21] Appl. No.: 835,627

[22] Filed: Apr. 9, 1997

Related U.S. Application Data

[63] Continuation of Ser. No. 470,725, Jun. 6, 1995, abandoned.
[51] Int. Cl.$^6$ .................................................. G03F 7/26
[52] U.S. Cl. ........................ 430/313; 430/315; 430/330
[58] Field of Search .................................. 430/311, 313, 430/315, 319, 324, 329, 330

[56] References Cited

U.S. PATENT DOCUMENTS

| | | | |
|---|---|---|---|
| 4,239,312 | 12/1980 | Myer et al. | 339/17 |
| 4,670,297 | 6/1987 | Lee et al. | 427/91 |
| 4,857,481 | 8/1989 | Tam et al. | 437/182 |
| 5,408,742 | 4/1995 | Zaidal | 29/846 |

OTHER PUBLICATIONS

M. P. Lepselter, "Air-Insulated Beam-Lead Crossovers for Integrated Circuits", *The Bell System Technical Journal*, vol. 47, No. 2, Feb. 1968, pp. 269-271.

*Primary Examiner*—Kathleen Duda
*Attorney, Agent, or Firm*—V. D. Duraiswamy; W. K. Denson-Low

[57] ABSTRACT

A method for fabricating resilient z-axis contacts to electrically interconnect IC wafers or MCMs in 3-D integrated circuits uses photolithography to provide larger carrier sizes, higher contact densities by decreasing the spacing, smaller contact footpads, and precise control of the contact's shape and position. The contacts are fabricated by forming photoresist patterns on the carrier's top and bottom surfaces that are initially rectangular, and then reflowing the photoresist materials to provide smooth surfaces suitable for forming the metal contacts, and depositing metal layers over the respective patterns. Second photoresist patterns are formed over respective metal layers to conform with the contact's shape, the metal is etched away according to the pattern, and the photoresists are removed such that the remaining metalization forms a resilient z-axis contact that is attached to the carrier and extends therefrom with a predetermined shape.

9 Claims, 7 Drawing Sheets

METHOD FOR FABRICATING RESILIENT Z-AXIS CONTACTS FOR ELECTRICALLY INTERCONNECTING INTEGRATED CIRCUITS ON A PLURALITY OF STACKED CARRIERS

This is a continuation of application Ser. No. 08/470,725, filed Jun. 6, 1995, now abandoned.

BACKGROUND OF THE INVENTION

1. Field of the Invention

The present invention generally relates to the field of z-axis connection of integrated circuits (ICs), and more specifically to a method for fabricating resilient z-axis contacts using photolithography.

2. Description of the Related Art

In conventional computers, printed circuit boards route signal traces along the board's surface to an external edge connector which is plugged into a backplane to facilitate communication between circuits on the individual boards. The number of signals that are communicated between boards is much larger than the number of available connector pins. Hence, the signals must be multiplexed, which reduces the computer's bandwidth. The potentially long signal paths between two chips on separate boards increases the amount of parasitic capacitance and power required to drive the circuitry.

A 3-D Computer includes IC devices in the xy plane, and utilizes z-axis, i.e. vertical, interconnections, such as those described in U.S. Pat. No. 4,239,312, between the devices to reduce signal path length and power consumption, and to increase bandwidth. FIGS. 1a and 1b are orthogonal sectional views of a portion of a 3-D Computer 10 that includes IC wafers 12 and 14 that are electro-mechanically connected in the z-axis. Wafer 12 includes redundant circuits 16a and 16b having circuit leads 17a and 17b respectively, and wafer 14 includes circuits 18a and 18b with leads 19a and 19b. Circuit leads 20a and 20b, 21a and 21b are formed on the bottom surfaces of wafers 12 and 14 respectively. Feedthroughs 22 and 23 extend from the top surface through to the bottom surface of wafers 12 and 14 respectively, and electrically connect circuit leads 17a and 20a, and 19a and 21a respectively. The feedthroughs are formed by a thermomigration process of aluminum into the wafer, and provide z-axis signal paths through each wafer.

Microbridges 24, 26, 28, and 30 are disposed on the top and bottom surfaces of wafers 12 and 14 respectively with opposite ends of the microbridges contacting circuit leads 17a and 17b, 20a and 20b, 19a and 19b, and 21a and 21a respectively. One end of each bridge contacts a circuit lead in electrical contact with a feedthrough. Each microbridge is a flexible metal arc spanning approximately 500 microns with a height of approximately 50 microns, and provides a resilient z-axis contact for interconnecting IC wafers As shown in FIGS. 1a and 1b, wafers 12 and 14 are electrically and mechanically connected by bringing opposed microbridges 26 and 28, formed orthogonal to each other to tolerate wafer distortion and misalignment, into contact. The microbridges compress to form a good electromechanical connection, and can be covered with solder and heated to form a permanent connection between the wafers. The feedthroughs and microbridges allow the ICs to be connected directly in the z-axis, reducing the signal path length and increasing the bandwidth.

FIGS. 2a through 2e are sectional views illustrating the steps of a prior technique for fabricating the microbridges shown in FIG. 1 using bi-metal shadow masks. Each mask has a predetermined pattern designed for the IC layout and desired bridge shape, and is held approximately 250 microns above the wafer. In the first step of the fabrication process, as shown in FIG. 2a, a source 32 evaporates salt (sodium-chloride) at approximately 1400° C. through a molybdenum shadow mask 34 to deposit a spacer 36 on a top surface 38 of an IC wafer 40. The wafer was previously fabricated to include redundant circuits 42a and 42b with circuit leads 44a and 44b electrically connecting the circuits to a feedthrough 46 which extends through the wafer to contact a circuit lead 48 on the wafer's bottom surface, and another circuit lead 50 on the bottom surface. In the next step shown in FIG. 2b, the wafer is flipped over and the source evaporates salt through another shadow mask 52 to deposit a spacer 54 on a bottom surface 56 of the wafer.

FIG. 2c shows the next step in which, a source 58 deposits metal through a shadow mask 60 on top of spacer 54 to form a microbridge 62. Typically, four metal layers are consecutively deposited to form a conductive bridge that is both resilient and compliant. The first and third layers are chromium which minimizes the diffusion between adjacent metals. The second layer is copper which provides the resilience and compliance properties, and the fourth and outer layer is indium-tin which provides a good conducting contact. The sectional view shown in FIG. 2c cuts through the microbridge, which extends into the wafer; one end of the microbridge (not shown) contacts lead 50, and the other end contacts another circuit lead in the wafer (not shown). In FIG. 2d, the wafer has been flipped over, and source 58 deposits metal through a shadow mask 64 onto spacer 36 to form a microbridge 66 with opposite ends contacting circuit leads 44a and 44b to electrically connect the redundant circuits, and formed orthogonal to microbridge 62. In the last step, as shown in FIG. 2e, salt spacers 36 and 54 were dissolved, and microbridges 62 and 66 provide resilient and compressible contacts for z-axis connection of the IC wafer on which they are formed. Although it appears in the sectional view taken at the bridge's peak, that microbridge 62 is disconnected, it is adhered to signal trace 50.

This shadow mask technique is simple and has performed adequately for 3-D packaging in the past, but has certain limitations that make it insufficient for the latest high density VLSI (very large scale integrated) devices. The smallest spacing between bridges is approximately 500 microns because of the material scattering inherent in the evaporation and deposition processes, and the mask's physical structure. If the mask is too large or if the hole density is too great, the mask loses structural integrity and sags significantly. Sagging distorts the deposited salt or metal patterns, and can cause the mask to stick to the deposited material. Therefore, the mask size is limited to approximately one square inch and patterns approximately 1000 microbridges, which effectively limits the size of the microbridge array and number of circuit contacts that can be employed efficiently in 3-D Computers. Furthermore, during the high temperature evaporation and deposition processes, the metal mask expands significantly relative to the wafer; this effectively shifts its position and distorts the shape and position of the deposited materials. The evaporation technique doesn't allow precise control of the microbridge's shape, has a foot pad size of at least 100 microns, and allows undissolved salt traces to corrode the bridges to the point of structural failure.

Advances in VLSI technology require a method for fabricating microbridges over a larger area, with smaller bridge-to-bridge spacings, smaller footpad size, precise shape, and exact positioning that tolerate wafer distortion and misalignment.

Air bridges are also used in high speed ICs to provide in-plane electrical connections between device electrodes and signal trace crossovers. The air bridge is used in lieu of a dielectric spacer to reduce parasitic capacitance, and is just tall enough, typically two to three microns, to isolate the top signal trace from the bottom signal trace.

In one method, photolithography is used to form an air bridge to span the gap in the top trace by forming metal posts on the ends of the top trace on either side of the gap, and forming a lintel between the posts. FIGS. 3a through 3i are sectional views illustrating the steps in the prior fabrication method of the air bridge for high speed ICs. FIG. 3a shows a silicon substrate 68 having orthogonal traces 70 and 72. At this stage of the fabrication, trace 70 has a gap where the two traces would cross. In FIG. 3b a photoresist 74 is deposited on the substrate's surface, and patterned to define holes 76 and 78 on top of the ends 80 and 82 of trace 70 on either side of trace 72. In FIG. 3c a single metal layer 84 is deposited on top of the photoresist such that the metal partially fills holes 76 and 78, and is secured to trace ends 80 and 82. The ratio of the photoresist's height to the width of the holes is sufficient to separate the metal deposited on the trace ends from the metal deposited on top of the photoresist. In FIG. 3d the photoresist is lifted off the substrate leaving two metal posts 86 and 88 approximately 2–3 microns tall on opposite side of the trace 72.

In FIG. 3e, a photoresist spacer 90 is formed on the substrate's surface with a height equal to the post's height. In FIG. 3f, a metal layer 92 is deposited on top of the photoresist and is secured to the top of the posts. A third photoresist 94 is patterned on top of the metal layer to form a spacer between the outside edges of the two posts, FIG. 3g. The exposed metal is etched away and the photoresist removed in FIG. 3h, leaving an air bridge 96 comprised of the two posts 86, 88 and a cross bar 98 electrically connecting the two segments of trace 70.

These air bridges are used only for in-plane lateral interconnections between ICs to reduce the circuit capacitance normally associated with separating crossing signal traces by a dielectric spacer. The described fabrication technique requires three photoresist steps, and creates four separate contacts in the formation of the bridge: two contacts between the posts and the substrate, and two contacts between the posts and the crossbar. This conflicts with the general design rule of minimizing the number of contacts, since fabricating mechanically and electrically reliable contacts is very difficult.

U.S. Pat. No. 4,670,297 describes a method for fabricating lateral air bridge contacts in which a 3 micron deep photoresist pattern, sensitive to low UV light and opaque to deep UV light, is patterned on the surface of an IC to expose the drain electrodes of the transistors. The resist is heated to provide tapered side walls which meet the flat top surface of the resist at a sharp corner. A second 3.5 micron photoresist, sensitive to deep UV light, is deposited over the IC, and a third 0.5 micron photoresist is deposited on top of it. The second and third resists are developed to form an aperture with overhanging side walls above the first photoresist pattern. A thin layer of titanium is deposited over the IC to adhere to the substrate, and a thicker layer of gold is deposited on top of the titanium. The second and third photoresist are lifted-off, and the first photoresist is dissolved, to provide lateral air bridges interconnecting the drain electrodes.

U.S. Pat. No. 4,857,481 describes a method for fabricating lateral air bridge contacts in which a photoresist pattern with tapered sidewalls is formed on a semiconducting substrate, and a titanium ground plane is deposited over the resist pattern and the exposed substrate. A second photoresist pattern, having a different solubility from the first pattern, is formed on top of the ground plane, and a layer of gold is deposited on the exposed portions of the ground plane. The second resist is removed, and the exposed portion of the ground plane is etched away. Removing the first resist produces the lateral air bridge contacts.

SUMMARY OF THE INVENTION

The present invention seeks to provide a method for fabricating resilient z-axis contacts to electrically interconnect ICs formed on respective carriers that provides for larger fabrication areas, higher contact densities by decreasing the spacing between contacts, smaller contact footpads, and precise control of the contact's shape and position.

The contacts are fabricated by forming photoresist patterns on the carrier's top and bottom surfaces in accordance with the desired contact shapes, reflowing the photoresist materials to provide smooth surfaces suitable for forming the metal contacts, and depositing metal over the respective patterns. Photoresist patterns are formed on the respective metal layers to conform with the contact's desired shape, the metal is etched away according to the pattern, and the photoresists removed such that the remaining metalization forms a resilient z-axis contact attached to the carrier and extending therefrom with a predetermined shape.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE INVENTION

Advances in VLSI technology have increased the number of devices and circuit contacts on ICs used in 3-D integrated circuits such as 3-D Computers, and thus requires a higher density of reliable z-axis contacts for interconnecting the ICs. The ICs may be formed on a common wafer, in which case the z-axis contacts are formed on the surface of the wafer. Alternately, the ICs can be formed in respective recesses of a substrate, i.e. a multichip module (MCM), with the z-axis contacts being formed on the substrate surface and electrically connected to the ICs. MCMs are IC substrates that receive off-the shelf ICs. The present invention provides a simple and highly effective fabrication technique that uses photolithography to form the z-axis contacts. Mating contacts on adjacent carriers (wafers or substrates) are secured to their respective carrier surfaces and extend therefrom to contact each other. The contacts are resilient and flexible to provide reliable connections.

The preferred contact is the microbridge, which spans approximately 500 microns with a height of 50 microns at its peak, and is secured to the wafer at both ends. Alternately, the contact could be a microspring in which one end is attached to the carrier surface and the other end is free to flex when contact is made with a similar contact during stacking. The photolithography process allows the microspring contacts to have a linear or curved shape.

Figure 4A:
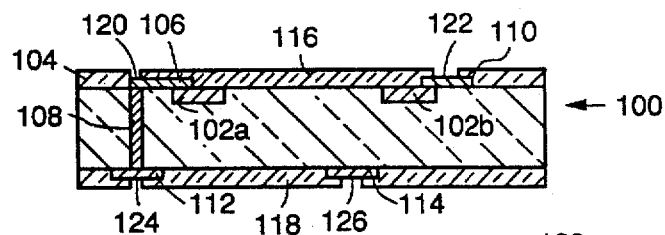
FIGS. 4a through 4j are sectional views illustrating the preferred embodiment of the invention for fabricating resilient z-axis contacts using photolithography.

FIGS. 4a through 4j are sectional views illustrating an embodiment of the invention for fabricating microbridges using photolithography. The fabrication method is easily adapted to other contact shapes by changing the photoresist and metalization patterns. FIG. 4a is a sectional view of an IC wafer 100 that includes redundant circuits 102a and 102b formed in the wafer's top surface 104, a circuit lead 106 that provides a signal path on the top surface to connect circuit 102a to a feedthrough 108 which extends between the wafer's top and bottom surfaces, a circuit lead 110 that provides a signal path that is electrically connected to circuit 102b, and leads 112 and 114 on the wafer's bottom surface. Oxide layers 116 and 118 are formed on the wafer's top and bottom surfaces to insulate the wafer. A hole pattern exposes portions of the leads 106 and 110 through oxide layer 116 to form aluminum contact pads 120 and 122, respectively. A second pair of contact pads are formed on the wafer's bottom surface with an orientation orthogonal to the contact pads 120 and 122 on the wafer's top surface. The second pair of contact pads are not shown in this sectional view. Leads 124 and 126 are formed on the bottom surface to connect the contacts pads to the feedthrough.

Figure 4B:
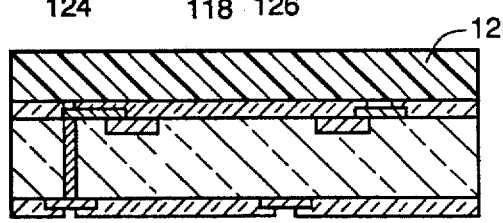
Figure 4C:
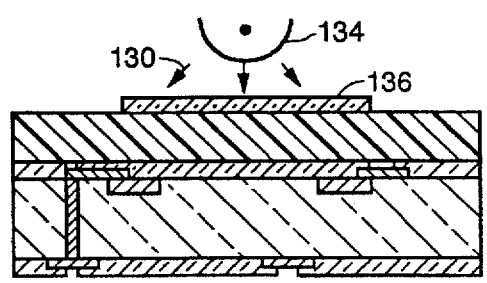
Figure 4D:
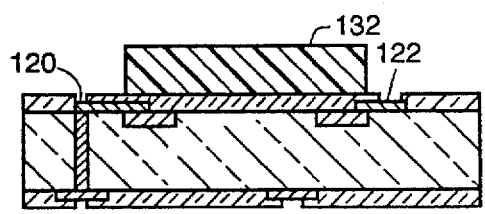

In the first step as shown in FIG. 4b, a photoresist layer 128 of uniform thickness is formed on top of the wafer by placing a drop of resist on the center of the wafer, and preferably spinning the wafer at 3000 rpm for 3 seconds. The wafer is pre-baked at approximately 110° C. for 3–4 minutes to remove residual solvents, and to improve the resist's adhesion. In subsequent steps depicted in FIGS. 4c and 4d, the photoresist is exposed to a pattern of light 130, and developed to form a spacer 132 between aluminum pads 120 and 122 on the wafer's surface. The light pattern is preferably produced by a contact-print aligner 134 projecting light around a mask 136 with an intensity of 30 mW/cm² at a wavelength of 365 nm for 75 seconds. The resist is developed in a developing solution at 25° C. for approximately two minutes, and rinsed in de-ionized water to remove it's exposed portions.

Figure 4E:
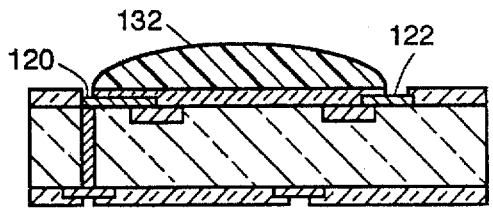

The photoresist spacer 132 has a rectangular shape with sharp corners, and depositing metal onto the spacer at this stage would produce microbridges with extremely weak corner points. As shown in FIG. 4e, the spacer is reflowed in a vacuum oven at 150° C. at approximately 100 mm mercury for 2 hours to round the corners and provide a smooth shape suitable for forming the microbridge contact. The reflow process also improves the resist's adhesion, thermal stability, and etch resistance. After the 2 hour heat cycle, the oven temperature is ramped down at a rate of 3° C. every five minutes between 150° and 130° C. to avoid cracking the photoresist. Photoresist material is a gel that maintains its shape at normal temperatures. Heating the gel makes it viscous such that it flows in accordance with surface tension, and becomes rounded. The shape of the resist is controlled by the temperature and cycle time; the higher the temperature and longer the exposure, the smoother the resist will become.

Figure 4F:
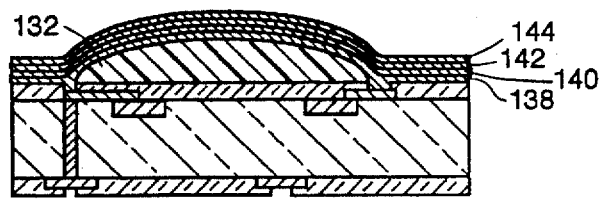
Figure 4G:
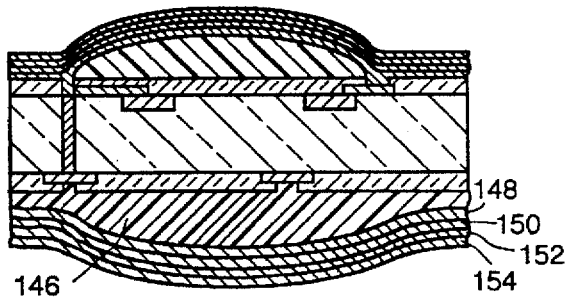

In the next step shown in FIG. 4f, four metal layers 138, 140, 142, and 144 are evaporated by an electron beam, or alternatively deposited by sputtering, over the spacer and the top surface of the wafer, and adhered to contact pads 120 and 122. The first and third layers can be W/Ti, Ni, Pt, Cr or other metals that minimize inter-diffusion of adjacent metals. The second layer is Cu or a copper compound that makes the bridge flexible, resilient and compliant. The composition and thickness depends on the requirements for the particular application. The final layer is a good conductor, typically gold. A bridge is typically composed of 500 angstroms W/Ti, 3 microns Cu, 500 angstroms W/Ti and 3000 angstroms Au, or alternatively 500 angstroms Cr, 3 microns Cu, 500 angstroms Cr and 3000 angstroms Au. The bridge material composition and number of layers can vary depending upon the application. The photoresist and metal deposition steps from FIGS. 4b through 4f are repeated for the backside of the wafer to form a photoresist spacer 146 between the aluminum contact pads, and four metal layers 148, 150, 152, and 154 on the spacer and adhered to the contact pads as shown in FIG. 4g.

Figure 4H:
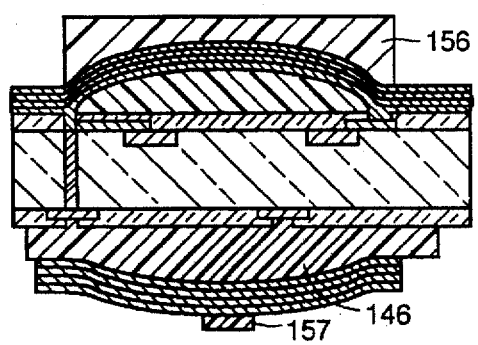

In FIG. 4h a photoresist pattern 156 is formed on top of the upper metal layers 138–144 by coating the wafer's top side with a photoresist and spinning it at 2500 rpm for 3 seconds. The wafer is placed in a vacuum box for approximately one hour, and then pre-baked on a hot plate at 114° C. for three minutes. The wafer's top side is exposed to a light pattern using a contact print aligner and a bridge mask. The resist is developed in developing solution at 25° C. for about two minutes, and rinsed in de-ionized water to removed the exposed portions. The wafer is post-baked in a convection oven at 120° C. for 30 minutes to drive off any solvents. A photoresist pattern 157 is formed over lower metal layers 148–154 with a similar process.

Figure 1A:
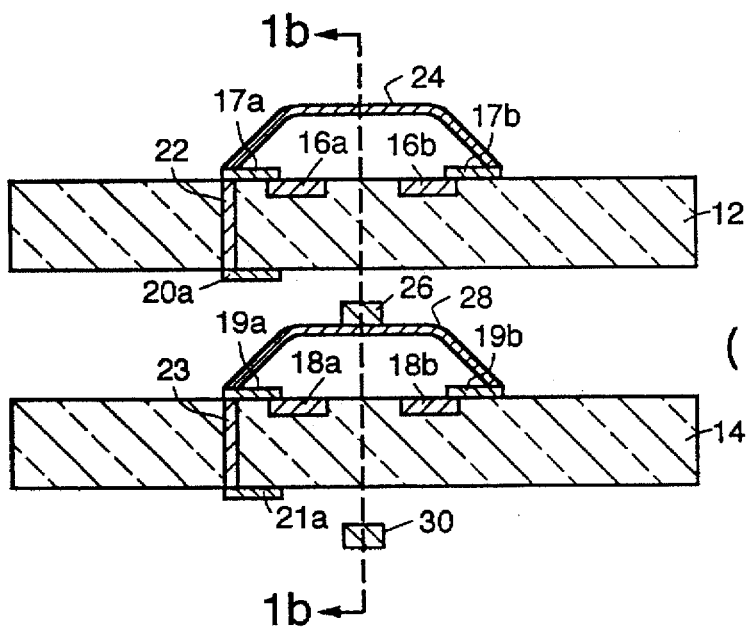
FIGS. 1a and 1b described above, are orthogonal sectional views of a portion of a prior 3-D Computer that includes IC wafers electro-mechanically connected in the z-axis by microbridges.
Figure 1B:
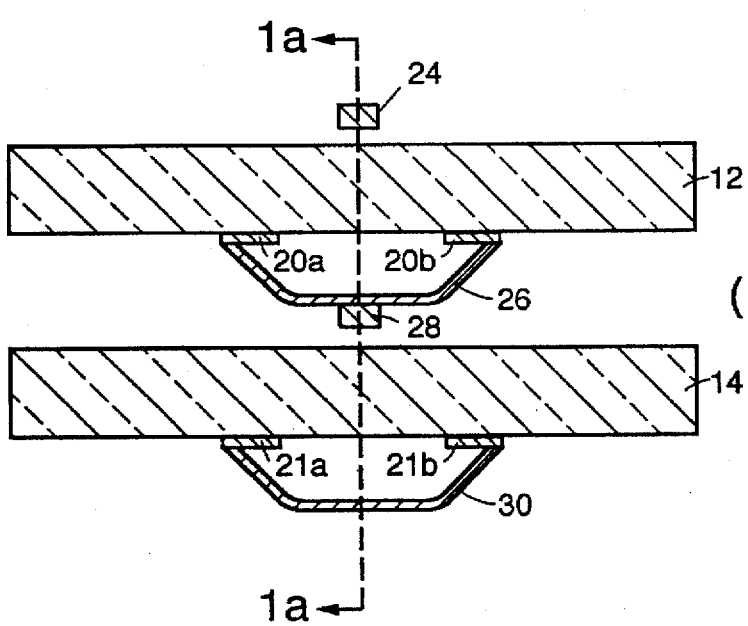
Figure 2A:
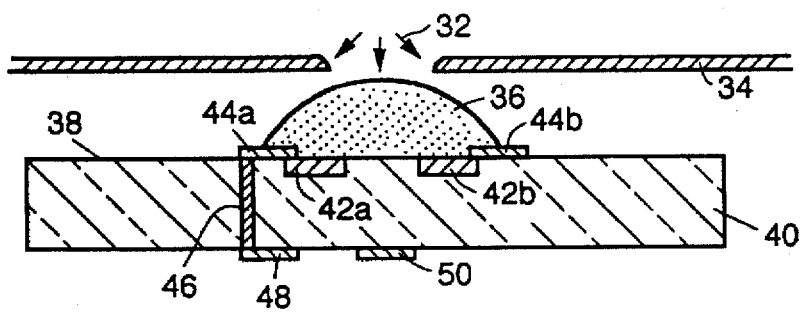
FIGS. 2a through 2e described above, are sectional views illustrating a prior art method for evaporating materials through shadow masks to form the microbridges shown in FIG. 1.
Figure 2B:
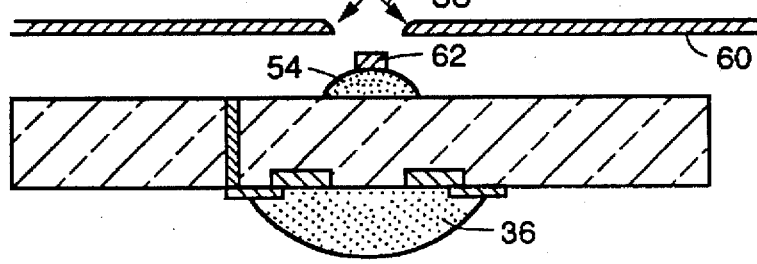
Figure 2C:
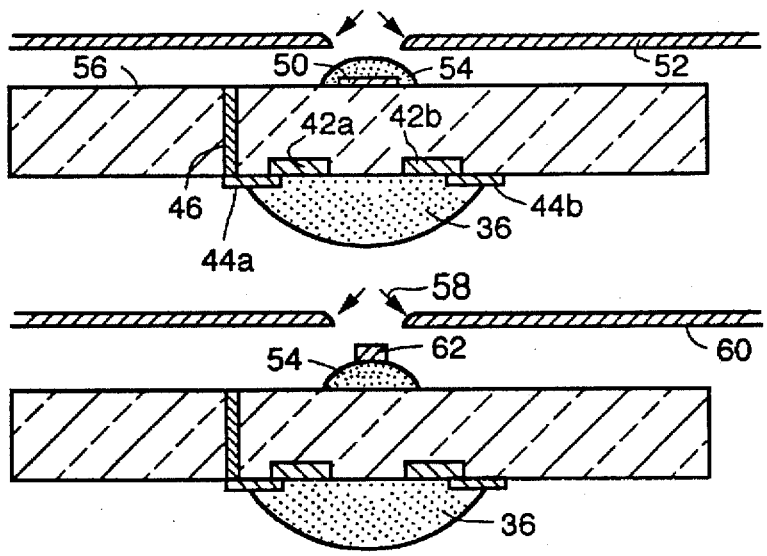
Figure 2D:
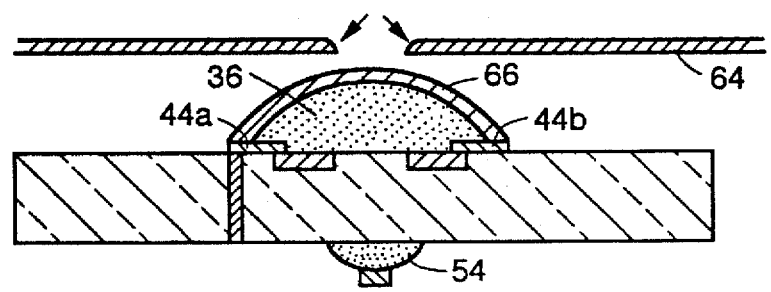
Figure 2E:
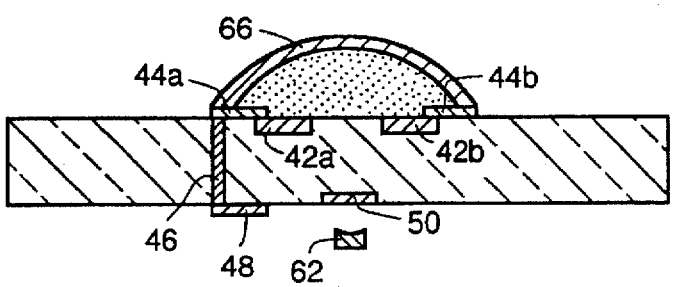
Figure 3A:
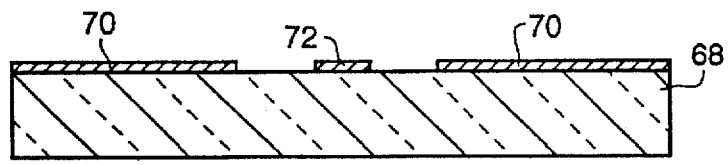
FIGS. 3a through 3h described above, are sectional views illustrating a prior photolithographic technique for fabricating an air bridge for high speed ICs.
Figure 3B:
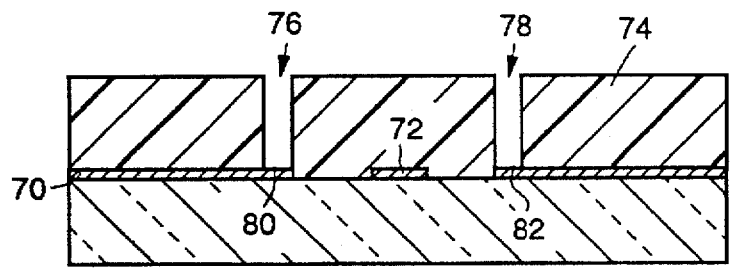
Figure 3C:
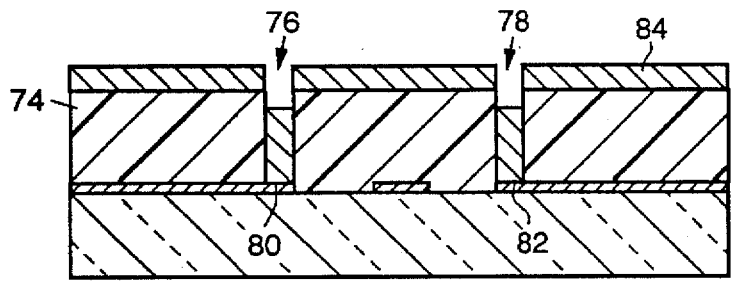
Figure 3D:
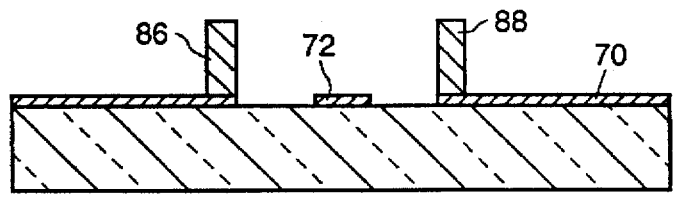
Figure 3E:
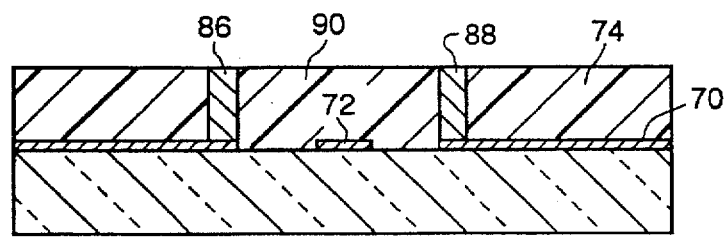
Figure 3F:
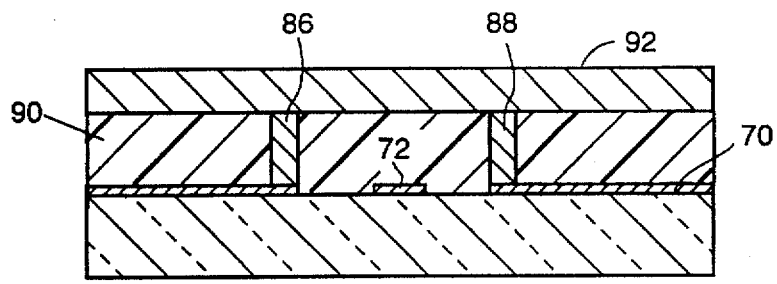
Figure 3G:
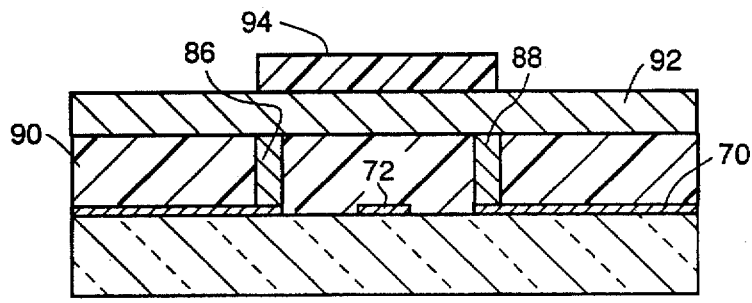
Figure 3H:
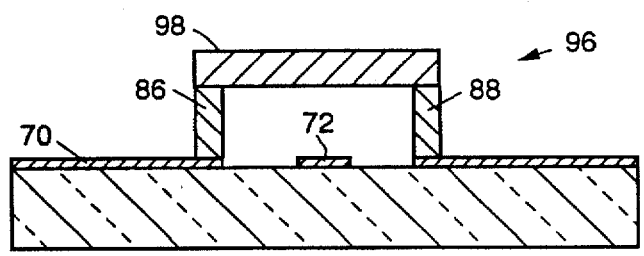
Figure 4I:
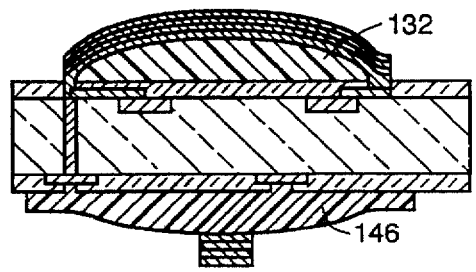
Figure 4J:
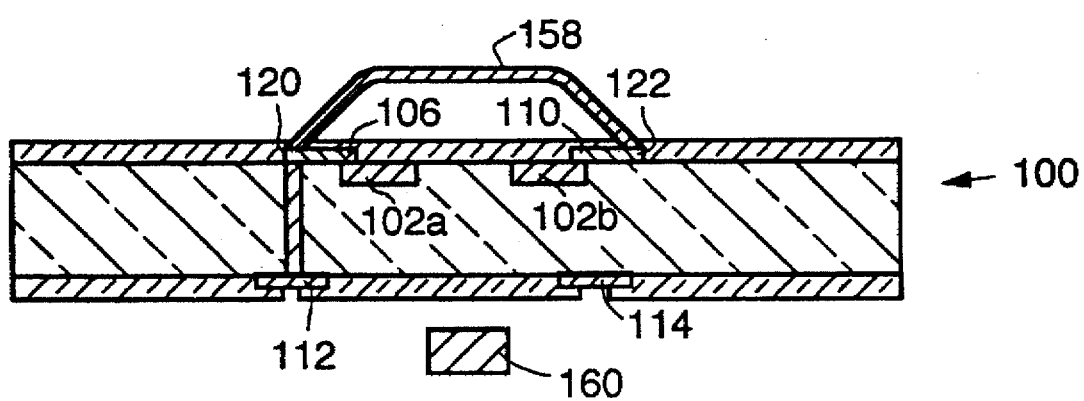

As shown in FIGS. 4i and 4j, the metal layers 138–144 and 148–154 are etched and the photoresist patterns 132 and 146 are dissolved to form respective microbridges 158 and 160 on the wafer's top and bottom surfaces. In the metal evaporation process, it is inherent that the metal adheres to the underlying aluminum pads, and opposite ends of bridge 158 are secured to pads 120 and 122 respectively. Opposite ends of bridge 160 are adhered to the contact pads on the backside of the wafer. As shown the bridges 158 and 160 on opposite surfaces of the wafer are orthogonal to each other. The z-axis interconnection of IC wafers is similar to that shown in FIG. 1: the bridges are oriented to tolerate thickness distortions in the wafers and misalignment, and can be covered with solder, and heated to form a permanent interconnection.

The photolithography technique is relatively simple, creates strong and flexible microbridges having only two contacts that compress up to their total height when interfaced to form a reliable electro-mechanical connection, and provides precise control over the size, shape and position of the microbridges. This technique has been demonstrated to fabricate approximately 20,000 microbridges over a 6.35 cm by 6.35 cm area on each side of a wafer having bridge-to-bridge spacing of approximately 50 microns and a footpad size less than 75 square microns. When compared to the prior art technique, this represents a fabrication area over six times larger, and a bridge density over three times larger. The advancement in microbridge fabrication facilitates the construction of more powerful 3-D Computers.

Figure 5:
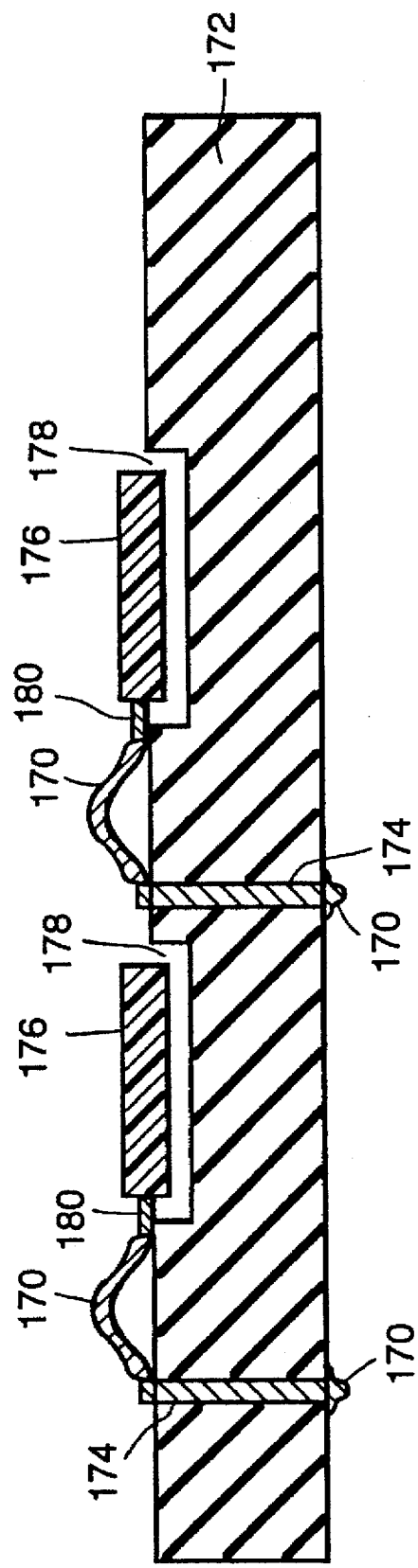
FIG. 5 is a sectional view of a multichip module substrate having z-axis contacts formed thereon in accordance with the present invention.

As shown in FIG. 5, the fabrication technique can be used to form microbridges 170 on the top and bottom surfaces of a substrate carrier 172 to interconnect MCMs. Carrier 172 is preferably formed from an insulative material such as aluminum nitride, ceramic, glass or plastic. Feedthroughs 174 are formed in carrier 172 to connect microbridges 170 on opposite sides of carrier 172. Off the shelf ICs 176 are placed in respective recesses 178 and electrically connected via leads 180 to microbridges 170 along the surface of carrier 172.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims. The technique can be applied to fabricate the air bridge crossovers; it's simpler and creates fewer contact points.

We claim:

1. A method for fabricating flexible, resilient and compliant z-axis contacts for electro-mechanically interconnecting integrated circuits on a plurality of stacked carriers, the fabrication of contacts on each carrier comprising:

providing a carrier having integrated circuitry with at least one contact pad exposed through an insulator layer that covers the integrated circuitry;

forming a first photoresist pattern on a surface of the insulator layer with an approximately rectangular shape;

reflowing the first photoresist pattern to provide a smooth shape that conforms with a predetermined contact shape suitable for forming the z-axis contact with a high strength and leaves the at least one contact pad and a portion of the insulator layer exposed;

depositing one metal layer over the first photoresist, in contact with the exposed portion of the insulator layer, and affixed to the at least one contact pad, said one metal layer comprising a compound that makes the z-axis contact flexible, resilient and compliant;

depositing another metal layer over said one metal layer, said other metal layer comprising a good conductor that makes the z-axis contact conductive;

forming a second photoresist pattern on the other metal layer over the first photoresist pattern to conform with the predetermined contact shape;

etching the metal exposed by the second photoresist pattern down to the insulator layer such that the z-axis contact is affixed to the at least one contact pad and extends therefrom with the predetermined shape; and removing the first and second photoresist patterns to define the flexible, resilient and compliant z-axis contact that is capable of flexing when contacted with an opposing z-axis contact on another one of the stacked carriers to provide an electro-mechanical connection between the contacting contacts.

2. A method in accordance with claim 1; wherein the step of reflowing the photoresist comprises heating the photoresist at a temperature sufficient to make it viscous and deform in accordance with the photoresists's surface tension.

3. A method in accordance with claim 2; wherein the first photoresist is heated for a predetermined amount of time to form the predetermined contact shape, and the degree of smoothing is proportional to the heating time.

4. A method in accordance with claim 1, further comprising:

depositing a first spacer layer between the first photoresist and said one metal layer; and depositing a second spacer layer between said one and said other metal layers; said first and second spacer layers being selected to reduce inter-diffusion between said contact pad, said one metal layer and said other metal layer.

5. A method for fabricating flexible, resilient and compliant microbridges on a carrier for electro-mechanically interconnecting integrated circuits on a plurality of stacked carriers, the fabrication of contacts on each carrier comprising:

providing a carrier having integrated circuitry with a pair of contact pads exposed through an insulator layer that covers the integrated circuitry;

forming a first photoresist pattern on a surface of the insulator layer with an approximately rectangular shape;

reflowing the first photoresist pattern to provide a smooth shape that conforms with a predetermined microbridge shape suitable for forming the microbridge with a high strength and leaves the pair of contact pads and a portion of the insulator layer exposed;

depositing one metal layer over the first photoresist, in contact with the exposed portion of the insulator layer, and affixed to the contact pads, said one metal layer being a compound that makes the microbridge flexible, resilient and compliant;

depositing another metal layer over said one metal layer, said other metal layer being a good conductor that makes the microbridge contact highly conductive;

forming a second photoresist pattern on the other metal layer over the first photoresist pattern and patterning it to define a bridge mask having first and second ends that are disposed over said contact pads, respectively, and which conforms with the predetermined microbridge shape;

etching the metal exposed by the bridge mask down to the insulator layer to form the microbridge with its ends affixed to the carrier at said contact pads and having a height approximately equal to the thickness of the reflowed photoresist; and removing the first and second photoresist patterns to define the flexible, resilient and compliant microbridge that compresses up to its height when contacted with an opposing microbridge.

6. A method for fabricating flexible resilient and compliant microbridges for electro-mechanically interconnecting integrated circuits (ICs) on a plurality of stacked carriers, the fabrication of microbridges on each carrier comprising:

a) providing a carrier having top and bottom surfaces, integrated circuitry on its top surface, circuit leads on both carrier surfaces, feedthroughs that extend through the carrier to electrically connect the leads on the top and bottom surfaces, and top and bottom insulator layers on the carrier that expose portions of the circuit leads to provide at least one contact pad on each of the top and bottom carrier surfaces;

b) forming a first photoresist pattern on the carrier's top surface that leaves a top contact pad exposed;

c) reflowing the first photoresist to provide a smooth shape suitable for forming the microbridge with a predetermined shape;

d) depositing a plurality of metal layers over the photoresist, in contact with the top insulator layer, and affixed to said top contact pad, said plurality of metal layers including one metal layer that comprises a compound that makes the microbridge flexible, resilient and compliant and another metal layer that is a good conductor and which makes the z-axis contact conductive;

e) repeating steps b through d on the carrier's bottom surface for a contact pad on that surface;

f) on the carrier's top and bottom surfaces, forming a second photoresist pattern on the other metal layer over the first photoresist pattern to conform with the microbridge's predetermined shape;

g) on the carrier's top and bottom surfaces, removing the metal exposed by the second photoresist pattern down to the insulator layer such that one end of the microbridge is affixed to the contact pad and the other end is affixed to the carrier; and h) removing the first and second photoresist patterns from the carrier's top and bottom surfaces to define the flexible, resilient and compliant microbridges, said one metal layer making the microbridges capable of flexing when contacted with opposing microbridges on another one of the stacked carriers to provide an electromechanical connection.

7. A method in accordance with claim 6, wherein the step of depositing the plurality of metal layers comprises:

depositing a first spacer layer;

depositing said one metal layer over said first spacer layer, said one metal layer having a first degree of conductivity;

depositing a second spacer layer over said one metal layer; and depositing said other metal layer over said second spacer layer, said other metal layer having a second degree of conductivity greater than said first degree, said first and second spacer layers being selected to reduce interdiffusion between said contact pad, said one metal layer, and said other metal layer.

8. A method in accordance with claim 6, wherein said one metal layer has a composition and thickness that makes the microbridge flexible enough that it is capable of flexing up to its height when contacted with the opposing microbridge.

9. A method in accordance with claim 6, wherein said carrier is provided with redundant integrated circuitry on its top surface, said top insulator layer exposing a pair of contact pads that are electrically connected to the redundant integrated circuitry, said first photoresist pattern is formed between the pair of contact pads, and said plurality of metal layers is deposited and etched so that the microbridge's ends are connected to the respective contact pads in said pair.

* * * * *